United States Patent
Basu et al.

(10) Patent No.: US 10,345,391 B2
(45) Date of Patent: Jul. 9, 2019

(54) METHOD AND APPARATUS FOR PREDICTING REMAINING USEFUL LIFE (RUL) OF BATTERY

(71) Applicant: SAMSUNG ELECTRONICS CO., LTD., Suwon-si (KR)

(72) Inventors: Suman Basu, Bangalore (IN); Krishnan Seethalakshmy Hariharan, Bangalore (IN)

(73) Assignee: Samsung Electronics Co., Ltd., Suwon-si (KR)

( * ) Notice: Subject to any disclaimer, the term of this patent is extended or adjusted under 35 U.S.C. 154(b) by 477 days.

(21) Appl. No.: 15/055,685

(22) Filed: Feb. 29, 2016

(65) Prior Publication Data
US 2016/0259013 A1    Sep. 8, 2016

(30) Foreign Application Priority Data

Mar. 3, 2015 (IN) .......................... 1028/CHE/2015
Jan. 13, 2016 (KR) ........................ 10-2016-0004259

(51) Int. Cl.
  *G01R 31/367* (2019.01)
  *G01R 31/392* (2019.01)
  *G01R 31/3828* (2019.01)

(52) U.S. Cl.
  CPC .......... *G01R 31/392* (2019.01); *G01R 31/367* (2019.01); *G01R 31/3828* (2019.01)

(58) Field of Classification Search
  CPC .............. G01R 31/3679; G01R 31/361; G01R 31/3651
  See application file for complete search history.

(56) References Cited

U.S. PATENT DOCUMENTS

| | | | | |
|---|---|---|---|---|
| 8,332,342 B1* | 12/2012 | Saha | .................. | G01R 31/3679 706/45 |
| 2012/0274285 A1* | 11/2012 | Chawla | ................. | H01M 10/44 320/127 |
| 2013/0113492 A1* | 5/2013 | Ezawa | ............... | G01R 31/3627 324/426 |
| 2015/0349385 A1* | 12/2015 | Hu | ..................... | G01R 31/3651 429/91 |
| 2016/0209472 A1* | 7/2016 | Chow | ................ | G01R 31/3648 |

OTHER PUBLICATIONS

Ning et al. "Capacity fade study of lithium-ion batteries cycled at high discharge rates", 2003, Journal of Power Sources, pp. 160-169. (Year: 2003).*
Ramadass et al. "Mathematical modeling of the capacity fade of Li-ion cells", 2003, Journal of Power Sources, pp. 230-240. (Year: 2003).*

(Continued)

Primary Examiner — Telly D Green
(74) Attorney, Agent, or Firm — NSIP Law

(57) ABSTRACT

Disclosed is a method of predicting a remaining useful life (RUL) including measuring an operating current during a charging cycle and a discharging cycle of a battery, calculating a capacity fade of a plurality of cycles of the battery based on degradation parameters and the measured operating currents, and predicting an RUL of the battery based on the calculated capacity fade.

10 Claims, 7 Drawing Sheets

(56) References Cited

OTHER PUBLICATIONS

Varia "In-Situ Capacity and Resistance Estimation Algorithm Development for Lithium-Ion Batteries Used in Electrified Vehicles" (thesis), 2014, Ohio State University, pp. 1-170. (Year: 2014).*

Eddahech et al. "Remaining useful life prediction of lithium batteries in calendar ageing for automotive applications" Elsevier, Microelectronics Reliability, 52, 2012, pp. 2438-2442. (Year: 2012).*

Hu et al. "Method or Estimating Capacity and Predicting Remaining Useful Life of Lithium-Ion Batter", IEEE 2014, pp. 1-8 (Year: 2014).*

Zhang, Yancheng, et al. "Cycle-Life Characterization of Automotive Lithium-Ion Batteries with $LiNiO_2$ Cathode." Journal of the Electrochemical Society 156.7 (2009): A527-A535. (9 pages in English).

* cited by examiner

FIG. 4B

Remaining Useful Life (RUL)
RUL(323K): 11000 Cycle
RUL(298K): 10000 Cycle
RUL(263K): 5000 Cycle

METHOD AND APPARATUS FOR PREDICTING REMAINING USEFUL LIFE (RUL) OF BATTERY

CROSS-REFERENCE TO RELATED APPLICATION(S)

This application claims the benefit under 35 USC § 119(a) of Indian Patent Application No. 1028/CHE/2015 filed on Mar. 3, 2015 in the Office of the Controller General of Patents, Designs & Trade Marks and Korean Patent Application No. 10-2016-0004259 filed on Jan. 13, 2016 in the Korean Intellectual Property Office, the entire disclosures of which are incorporated herein by reference for all purposes.

BACKGROUND

1. Field

The following description relates to a method and apparatus for predicting a remaining useful life (RUL) of a battery.

2. Description of Related Art

A battery is used as a rechargeable energy storage device because it provides a large amount of energy, has a high power density, and low costs are incurred as compared to other energy storage devices and applications. Due to inherent chemical reactions of the battery, the energy storage capacity of the battery may decrease as the battery is used and recharged. A rate of loss in capacity of the battery may depend on a temperature and the number of cycles of the battery.

Typical techniques of predicting a remaining useful life (RUL) of a battery relate to data-based techniques using regression-based approaches. The techniques may require a large quantity of data and a large onboard computation facility, which may also use a lame amount of time.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a method of predicting a remaining useful life (RUL), the method including measuring an operating current during a charging cycle and a discharging cycle of a battery, calculating a capacity fade for a plurality of cycles of the battery based on degradation parameters and the measured operating currents, and predicting an RUL of the battery based on the calculated capacity fade.

The plurality of degradation parameters may include at least one of an operating temperature, a minimum state of charge (SOC), a maximum SOC, or a material property.

The method may further include displaying the predicted RUL to indicate a time remaining until the battery reaches end-of-life (EOL) state.

The battery may include a plurality of cells, and the method may include identifying, from the plurality of cells, a cell having a least capacity, and displaying through a user interface a recommendation to replace the identified cell.

The method may include displaying a number of charging cycles remaining until the battery reaches an end-of-life (EOL) state.

The method may include displaying RULs corresponding to different operating temperatures of the battery, each of the RULs indicating a time remaining until the battery reaches an end-of-life (EOL) state when operated at an operating temperature.

In another general aspect, there is provided a device for predicting an RUL including a predictor configured to measure an operating current during a charging cycle and a discharging cycle of a battery, to calculate a capacity fade of a plurality of cycles of the battery based on degradation parameters and the measured operating currents, and to predict an RUL of the battery based on the calculated capacity fade.

The apparatus may include a controller comprising sensors configured to determine the degradation parameters.

A sensor of the controller may be configured to determine an operating current of the battery.

The degradation parameters may include at least one of an operating temperature, a minimum state of charge (SOC), a maximum SOC, or a material property.

The predictor may be configured to display the predicted RUL to indicate a time remaining until the battery reaches an EOL state.

Other features and aspects will be apparent from the following detailed description, the drawings, and the claims.

BRIEF DESCRIPTION OF THE DRAWINGS

FIG. 4B is a diagram illustrating an example of a user interface displaying an RUL to a user.

Figure 1:
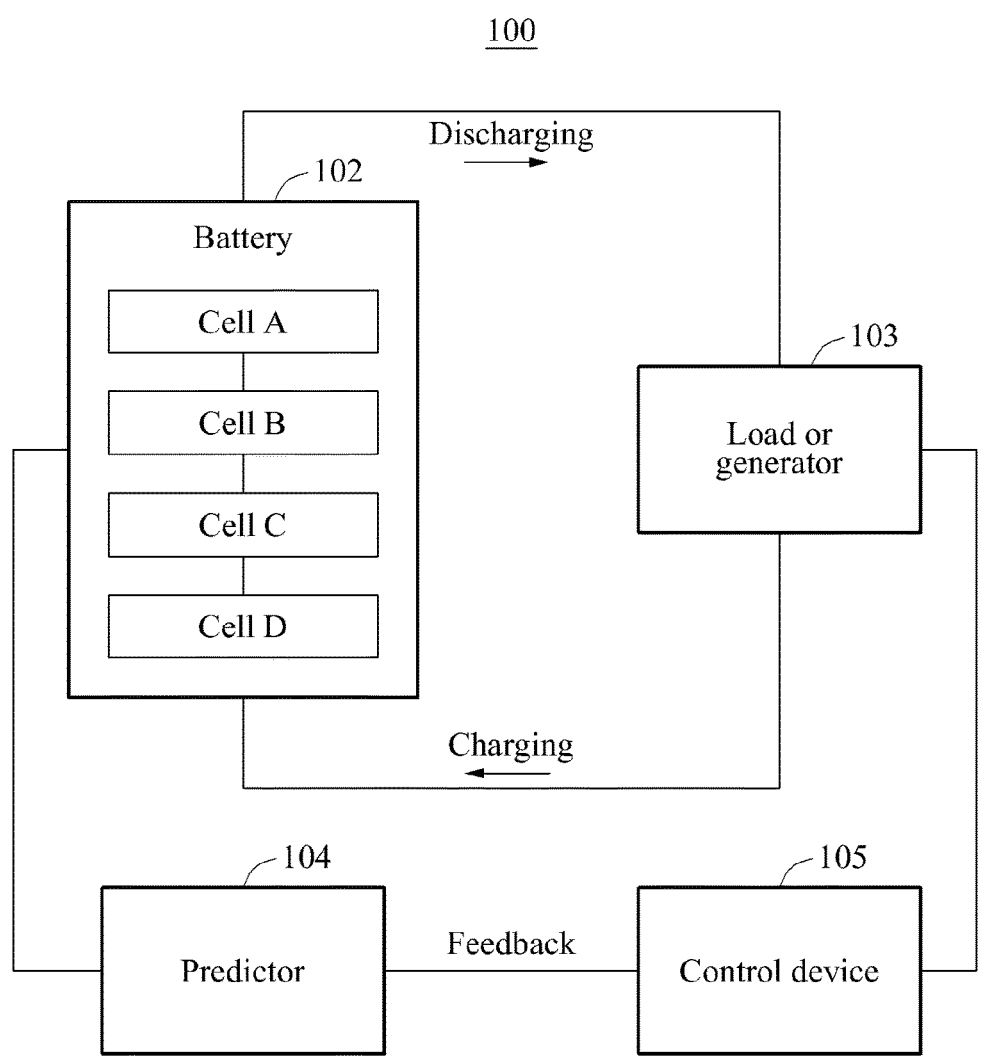
FIG. 1 is a diagram illustrating an example of a apparatus for predicting a remaining useful life (RUL) of a battery.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Various alterations and modifications may be made to the examples. Here, the examples are not construed as limited to the disclosure and should be understood to include all changes, equivalents, and replacements within the idea and the technical scope of the disclosure.

The terminology used herein is for the purpose of describing particular examples only and is not to be limiting of the examples. As used herein, the singular forms "a", "an", and "the" are intended to include the plural forms as well, unless the context clearly indicates otherwise. It will be further understood that the terms "include/comprise" and/or "have" when used in this specification, specify the presence of stated features, integers, steps, operations, elements, components, and/or combinations thereof, but do not preclude the presence or addition of one or more other features, numbers, steps, operations, elements, components, and/or groups thereof.

A method for predicting a remaining useful life (RUL) of a battery includes an operation of measuring an operating current during a charging cycle and a discharging cycle of the battery. The method includes an operation of calculating a capacity fade of a plurality of cycles of the battery based on the measured operating current ("I") and a plurality of degradation parameters.

The plurality of degradation parameters includes an operating temperature, a minimum state of charge (SOC), a maximum SOC, and a material property, for example. In an example, the minimum SOC and the maximum SOC are constant values dependent on a design of the battery.

The capacity fade is calculated by numerically integrating a capacity fade rate.

The method includes an operation of predicting the RUL of the battery based on the calculated capacity fade. The predicted RUL of the battery is displayed through a user interface. The predicted RUL indicates a time remaining until the battery reaches an end-of-life (EOL) state. Based on the displayed RUL, a user may perform a precautionary reaction. An RUL corresponding to a modified cycle of the battery is also displayed to be viewed by the user.

The user interface may be a physical structure that includes one or more hardware components that provide the ability to render a user interface and/or receive user input. The user interface can encompass any combination of display region, gesture capture region, a touch sensitive display, and/or a configurable area. The user interface can be embedded in the hardware or may be an external peripheral device that may be attached and detached from the apparatus. The user interface may be a single-screen or a multi-screen display or input. A single physical user interface can include multiple displays that are managed as separate logical displays permitting different content to be displayed on separate displays although part of the same physical user interface.

The user interface may also be implemented as a wearable device, which is worn by a user. In one example, a wearable device may be self-mountable on the body of the user, such as, for example, a watch, a bracelet, or as an eye glass display (EGD), which includes one-eyed glass or two-eyed glasses. In another example, the wearable device may be mounted on the body of the user through an attaching device, such as, for example, attaching a smart phone or a tablet to the arm of a user using an armband, or hanging the wearable device around the neck of a user using a lanyard. The hardware disclosed here are for example only, and other hardware implementation are considered to be well within the scope of the present disclosure.

The method of predicting the RUL of the battery is performed under any operating condition. The method is implemented without an additional device or circuit. In an example, a cell or module having a lowest capacity is identified in the battery to selectively replace a cell or module having lowest capacity and performance.

As an example, the method is applied to predict an RUL for a new drive cycle that is a function of a driving pattern and a traffic condition.

The method is performed for an operation time less than a typical data-based model for predicting an RUL.

The method is performed in connection with the data-based model.

As an example, the method is applicable to an overall operating range of any electronic device including an electric moving body, such as, for example, an electric vehicle.

FIG. 1 illustrates an apparatus 100 for predicting an RUL of a battery 102. The apparatus 100 includes the battery 102, a predictor 104, a control device 105, and a load or a generator 103. The battery 102 provides electrical energy to supply power to the load. In an example, the load may be an electronic device, a laptop computer, or an electric moving body. The types of loads mentioned above are for illustrative purposes only, and any other load, which can be connected to the battery are considered to be well within the scope of the present disclosure.

The battery 102 includes at least one electrochemical cell in which chemical energy is stored. To supply power to the load, the chemical energy is converted into the electrical energy.

In an example, the generator used to charge the battery 102 is substituted for the load.

The battery 102 is provided in a form of, for example, a single battery or a plurality of cells including a cell A, a cell B, a cell C, and a cell D as illustrated in FIG. 1.

The battery 102 is, for example, a rechargeable battery including a rechargeable chemical composition. The battery 102 is, for example, a lithium-ion battery. For example, the battery 102 includes a lithium nickel cobalt aluminum (Li NCA) positive electrode.

The control device 105 controls the load or the generator 103 and controls the predictor 104. The control device 105 includes a plurality of sensors to determine an operating temperature, an operating current, and a plurality of degradation parameters of the battery 102. In an example the sensors may be disposed outside the control device 105.

The predictor 104 predicts the RUL of the battery 102 by calculating a capacity fade for a plurality of cycles of the battery 102 based on the plurality of degradation parameters. The degradation parameters includes, but are not limited to, the operating temperature, a minimum SOC, a maximum SOC, and a material property.

The predicted RUL of the battery 102 is displayed such that a remaining life of the battery until the battery 102 reaches an EOL state is indicated to the user. Based on the displayed RUL, the user may take precautions. An RUL for a modified cycle may be displayed to the user. To selectively replace a cell in the battery, a cell having a lowest capacity and performance is identified. For example, the cell B is identified to have the lowest capacity and a poor performance and thus, the user may replace the cell B.

Figure 2:
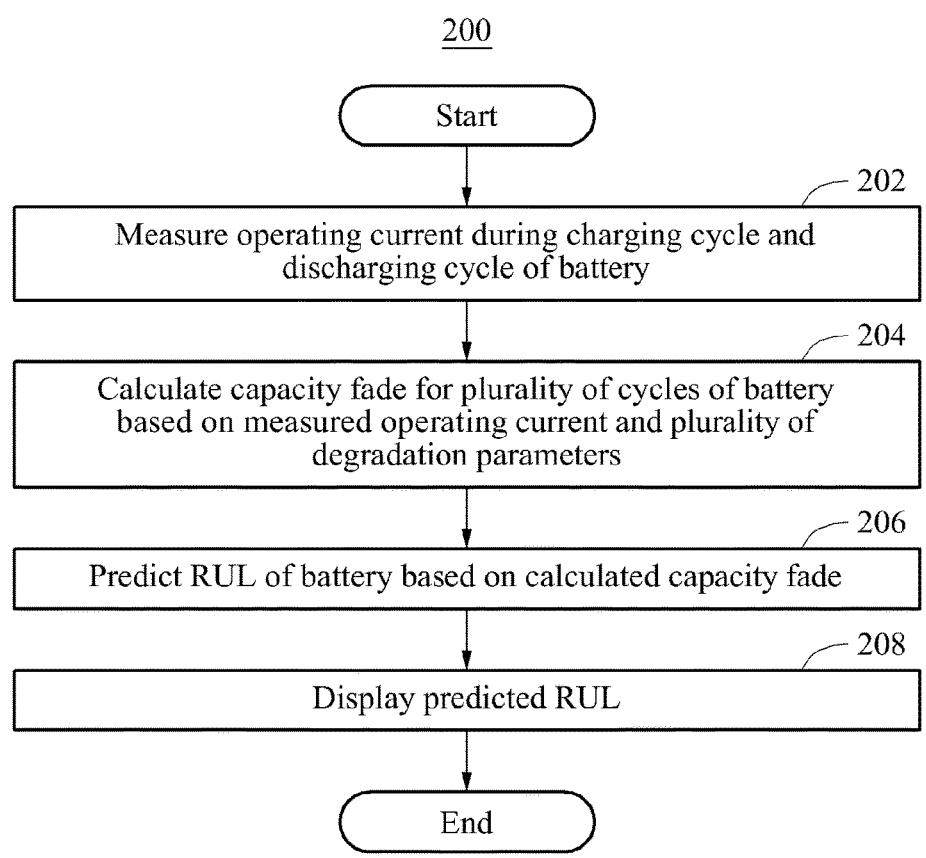
FIG. 2 is a diagram illustrating an example of a method of predicting an RUL of a battery.

FIG. 2 illustrates an example of a method 200 of predicting an RUL of a battery. The operations in FIG. 2 may be performed in the sequence and manner as shown, although the order of some operations may be changed or some of the operations omitted without departing from the spirit and scope of the illustrative examples described. Many of the operations shown in FIG. 2 may be performed in parallel or concurrently. The above descriptions of FIG. 1 is also applicable to FIG. 2, and is incorporated herein by reference. Thus, the above description may not be repeated here. The method 200 and the corresponding description provides a algorithm for a control program, which may be implemented using a microcontroller, a microprocessor, a processor, a computer, or a non-transitory computer readable storage medium.

In 202, an operating current is measured during a charging cycle and a discharging cycle of the battery 102. The predictor 104 measures, or is provided the measured information of the operating current during the charging cycle and the discharging cycle of the battery 102. An operating current (I) is measured during the charging cycle and the discharging cycle of the battery 102.

In 204, a capacity fade is calculated for a plurality of cycles of the battery 102 based on the measured operating current and a plurality of degradation parameters. The predictor 104 calculates the capacity fade for the plurality of cycles of the battery 102 based on the measured operating current (I) and the plurality of degradation parameters.

A capacity corresponding to each cycle may be calculated based on Equation 1, for example.

$$(C_{rel}^n)^{0.5} - (C_{rel}^{n-1})^{0.5} = -B(T)\int_0^{t_{cyl}^{n-1}} \exp\left[A\left(SOC_{pos}^{lim} - SOC_{pos}^{min} - \frac{SOC_{pos}^{max} - SOC_{pos}^{min}}{C_c^{n-1}}\int_0^t I dt\right)\right] dt$$

Equation 1

A capacity corresponding to an $n^{th}$ cycle is $$C_c^n = \int_0^{t_{cyl}^n} I dt.$$

A relative capacity corresponding to the $n^{th}$ cycle is $$C_{rel}^n = \frac{C_c^n}{C_c^0}.$$

A state of charge $SOC_{pos}$ of a positive electrode is $$\frac{c_{pos}^s}{c_{max,pos}^s}.$$

A molar concentration of lithium ions of the positive electrode is $c_{pos}^s$.

In Equation 1, Parameters A and B(T) are cell parameters and may be set or determined experimentally.

$SOC_{pos}^{lim}$ is a material property. Also, parameters $SOC_{pos}^{max}$ and $SOC_{pos}^{min}$ are constants based on a design of the battery 102.

The capacity fade is calculated by integrating a capacity fade rate by time.

In Equation 1, the capacity fade is calculated by performing numerical integration on the plurality of cycles using a sequential method, for example, a trapezoidal rule.

$$(C_{rel}^n)^{0.5} = (C_{rel}^{cutoff})^{0.5}$$
$$= (C_{rel}^0)^{0.5} - \sum_{i=1}^n B(T)\int_0^{t_{cyl}^{i-1}} \exp$$
$$\left[A\left(SOC_{pos}^{lim} - SOC_{pos}^{min} - \frac{SOC_{pos}^{max} - SOC_{pos}^{min}}{C_c^{i-1}}\int_0^t I dt\right)\right] dt$$

Equation 2

In Equation 2, n denotes an RUL corresponding to the number of cycles of the battery 102 before reaching the EOL state. Thus, n indicates the number of cycles remaining until the battery 102 reaches the EOL state.

Equation 1 is numerically integrated as shown below in Equation 3, for example.

$$(C_{rel}^n)^{0.5} - (C_{rel}^{n-1})^{0.5} =$$
$$-B(T)\sum_{k=1}^q \exp\left[A\left(SOC_{pos}^{lim} - SOC_{pos}^{min} - \frac{SOC_{pos}^{max} - SOC_{pos}^{min}}{C_c^{n-1}}\sum_{j=1}^p I_j \Delta t_j\right)\right]\Delta t_k$$

Equation 3

In Equation 3, $t = \sum_{j=1}^p \Delta t_j$, and $t_{cyl}^{n-1} = \sum_{k=1}^q \Delta t_k$. When $t = \sum_{j=1}^p \Delta t_j$ and $t_{cyl}^{n-1} = \sum_{k=1}^q \Delta t_k$ are applied to Equation 1, Equation 1 is expressed as Equation 3.

Equation 4 is obtained based on Equation 2.

$$(C_{rel}^n)^{0.5} = (C_{rel}^0)^{0.5} - \sum_{i=1}^n B(T_i)$$
$$\sum_{k=1}^q \exp\left[A\left(SOC_{pos}^{lim} - SOC_{pos}^{min} - \frac{SOC_{pos}^{max} - SOC_{pos}^{min}}{C_c^{n-1}}\sum_{j=1}^p I_j \Delta t_j\right)\right]\Delta t_k$$

Equation 4

Thus, when $t = \sum_{j=1}^p \Delta t_j$ and $t_{cyl}^{n-1} = \sum_{k=1}^q \Delta t_k$ are applied to Equation 2, Equation 2 is expressed as Equation 4.

In Equation 4, n indicates the number of cycles of the battery 102 before the battery 102 reaches the EOL state.

In 206, the RUL of the battery 102 is predicted based on the calculated capacity fade. For example, the predictor 104 predicts the RUL of the battery 102 based on the capacity fade.

In 208, the predicted RUL of the battery 102 is displayed. The predictor 104 displays the predicted RUL. In an example, the RUL is displayed to be viewed through a user interface (UI). The predicted RUL indicates a life remaining until the battery 102 reaches the EOL state. Based on the displayed RUL, the user takes precautions. For example, the RUL is displayed to be 3000 cycles to indicate that the remaining life until the battery 102 reaches the EOL state is 3000 cycles. Also, an RUL for a modified cycle is displayed to be viewed by the user.

Figure 3:
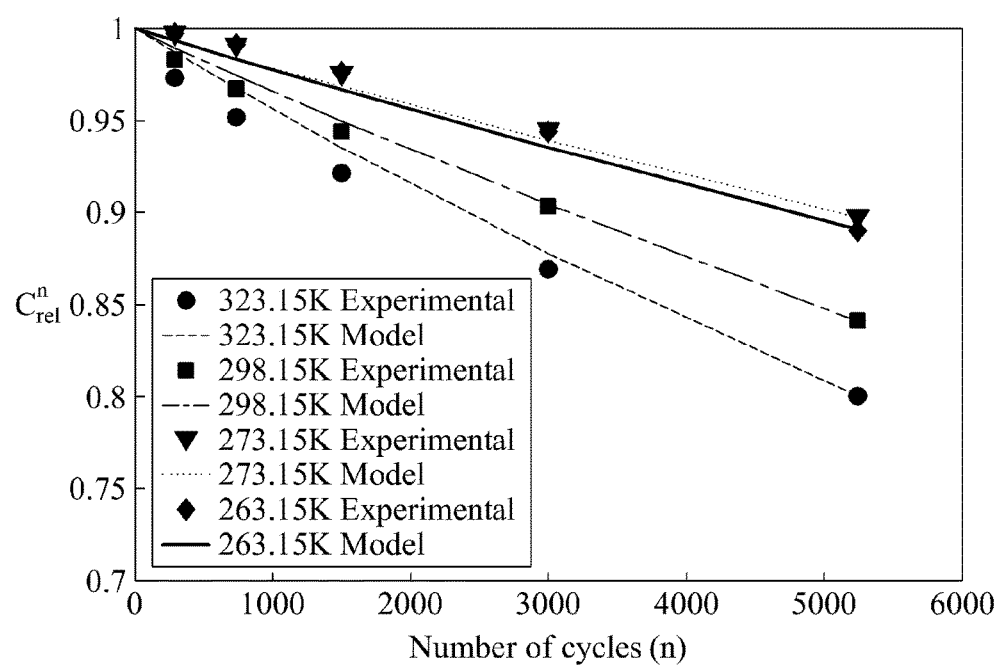
FIG. 3 is a diagram illustrating an example of a validation performed on a relative capacity based on the number of cycles and various reference temperatures of models at a constant operating current.

FIG. 3 illustrates an example of a validation performed on a relative capacity based on the number of cycles and various reference temperatures of models at a constant operating current. With respect to a constant operating current I, a closed form solution of Equation 2 is acquired as shown in Equation 5. The closed form solution is similar to the experiment result acquired at different operating temperatures, which is cited in a journal titled "The Electrochemical Society," 156 (7), A527-A535, (2009). All documents cited in the present disclosure, including published documents, patent applications, and patents, may be incorporated herein in their entirety by reference in the same manner as when each cited document is separately and specifically incorporated or incorporated in its entirety.

$$C_{rel}^n = (1+K_1 n)^{-2}$$ Equation 5:

In Equation 5, n denotes an RUL and indicates the number of cycles. Also, K1 is a constant.

In a graph of FIG. 3, a temperature value of a typical model is acquired from the journal titled "The Electrochemical Society," 156 (7), A527-A535, (2009).

The relative capacity is predicted using a given number of a cycle of the battery 102. For example, the relative capacity is predicted at n. As an example, when an application desires a cut-off capacity of 0.9 at a temperature of 298.15K, the cut-off capacity is predicted at about a $3000^{th}$ cycle as shown in the graph of FIG. 3. Here, the cut-off capacity is the same as a relative capacity $C_{rel}^n$.

In FIG. 3, through a comparison of results of experiments performed at various temperatures, the relative capacity of the battery 102 is predicted with an average accuracy of 99%.

Figure 4A:
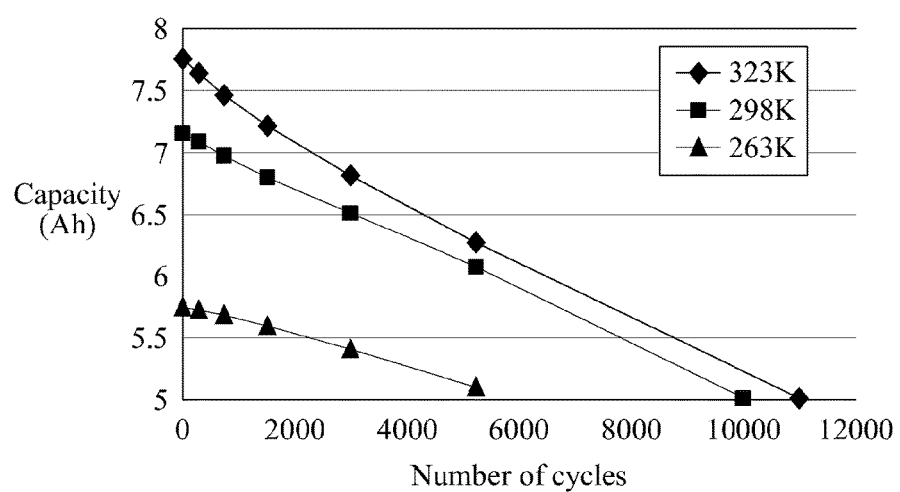
FIG. 4A is a diagram illustrating an example of a capacity loss over cycling based on various temperatures.

FIG. 4A illustrates an example of a capacity loss over cycling based on various temperatures. Referring to FIG. 4A, a capacity of the battery 102 decreases according to an increase in the number of cycles and an increase in a temperature of an operating current.

FIG. 4B illustrates an example of a user interface displaying an RUL to a user. Referring to FIG. 4B, RULs corresponding to various operating temperatures are displayed for a user. The user undertakes a precautionary action based on the displayed RULs. An RUL for a modified cycle of the battery 102 is also displayed for the user.

Figure 5:
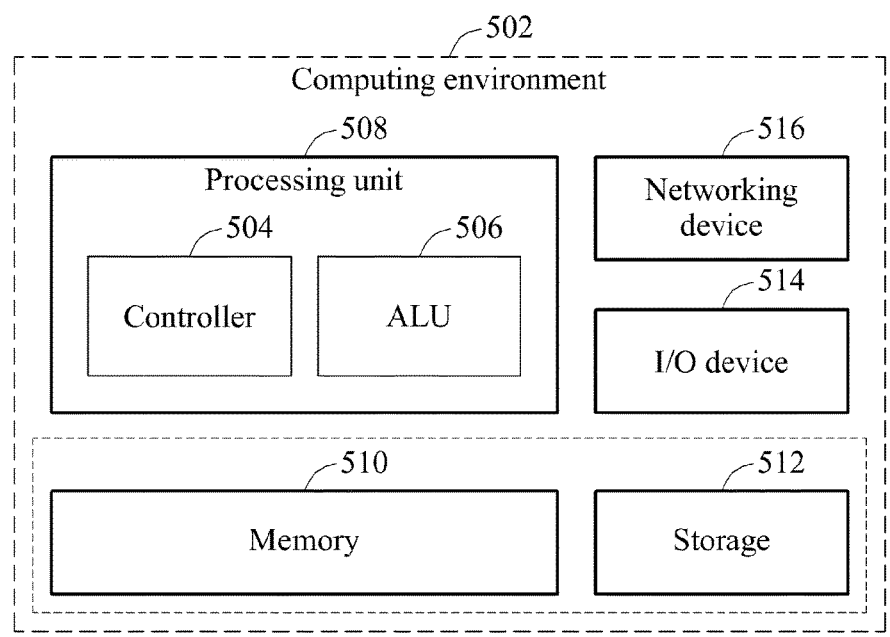
FIG. 5 is a diagram illustrating an example of a computing environment through which a method of predicting an RUL of a battery is implemented.

FIG. 5 illustrates a computing environment 502 through which a method of predicting an RUL of a battery is implemented. The computing environment 502 includes a processing unit 506 equipped with a controller 504 and an arithmetic logic unit (ALU) 506, a memory 510, a storage 512, a plurality of networking devices 516, a plurality of input and output (I/O) devices 514. The processing unit 508 is charge of executing instructions of an algorithm. The processing unit 508 receives commands from the controller 504 to perform processing operations according to one or more methods described herein. The logical and arithmetic operations involved in execution of the commands are computed using the ALU 506.

The overall computing environment 502 includes multiple homogeneous and/or heterogeneous cores, different kinds of multiple central processing units (CPUs), a special media, and other accelerators. The processing unit 508 processes instructions of an algorithm. In an example, a plurality of processing units 508 is located on a single chip or over multiple chips.

An algorithm including instructions and codes required for implementation is stored in the memory 510, the storage 512, or both the memory 510 and the storage 512. During a time of execution, the instructions are fetched from the memory 510 and/or the storage 512, and executed by the processing unit 508.

In a case of hardware implementation, various types of the networking devices 516 or external I/O devices 514 are connected to the computing environment 502 through a networking unit and an I/O device unit to support the implementation.

Figure 6:
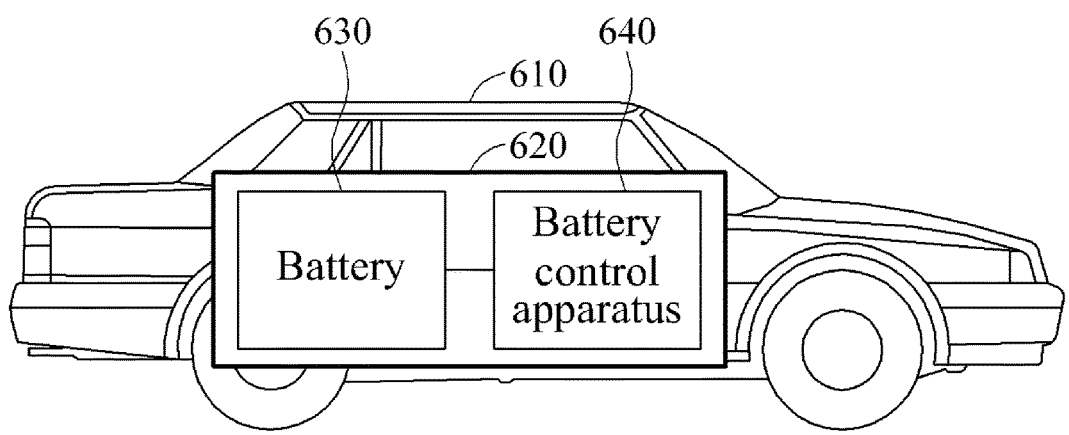
FIG. 6 illustrates an example of a method of predicting an RUL of a battery.

FIG. 6 illustrates an example of a method of predicting an RUL of a battery.

Referring to FIG. 6, in one or more embodiments, an Electric Vehicle 610 may include a battery system 620. The battery system 620 may include a battery 630, and a battery control apparatus 640, for example. The battery control apparatus 640 may predict an RUL of a battery 630, for example. The battery control apparatus 640 may operate similarly to the previous discussed predictor and/or control device of FIG. 1 and operations of FIG. 2, for example.

At least one method described with reference to FIGS. 1-6 may be provided in a form of an application operating in a processor in a tablet PC, a smart phone, a wearable device, or in a chip to be embedded in a smart phone, a wearable device, or a vehicle.

The apparatuses, units, modules, devices, and other components illustrated that perform the operations described herein with respect to FIGS. 1 and 5 are implemented by hardware components. Examples of hardware components include controllers, sensors, generators, drivers and any other electronic components known to one of ordinary skill in the art. In one example, the hardware components are implemented by one or more processors or computers. A processor or computer is implemented by one or more processing elements, such as an array of logic gates, a controller and an arithmetic logic unit, a digital signal processor, a microcomputer, a programmable logic controller, a field-programmable gate array (FPGA), a programmable logic array, a microprocessor, an application-specific integrated circuit (ASIC), or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The methods illustrated in FIG. 2 that perform the operations described herein with respect to FIG. 2 are performed by a processor or a computer as described above executing instructions or software to perform the operations described herein.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of predicting a remaining useful life (RUL), the method comprising:
   measuring an operating current during a charging cycle and a discharging cycle of a battery;
   calculating a capacity fade at a first cycle of the battery based on the measured operating currents, a state of charge (SOC) limit, a minimum SOC, a maximum SOC, and a capacity of the battery at a cycle prior to the first cycle; and
   predicting an RUL of the battery based on the capacity fade.

2. The method of claim 1, further comprising displaying the predicted RUL to indicate a time remaining until the battery reaches an end-of-life (EOL) state.

3. The method of claim 1, wherein the battery comprises a plurality of cells, and the method further comprises:
   identifying, from the plurality of cells, a cell having a least capacity; and
   displaying through a user interface a recommendation to replace the identified cell.

4. The method of claim 1, further comprising displaying a number of charging cycles remaining until the battery reaches an end-of-life (EOL) state.

5. The method of claim 1, further comprising displaying RULs corresponding to different operating temperatures of the battery, each of the RULs indicating a time remaining until the battery reaches an end-of-life (EOL) state when operated at an operating temperature.

6. An apparatus for predicting a remaining useful life (RUL) of a battery, the apparatus comprising:
   a predictor configured to measure an operating current during a charging cycle and a discharging cycle of a battery, to calculate a capacity fade at a first cycle of the battery based on the measured operating currents, a state of charge (SOC) limit, a minimum SOC, a maximum SOC, and a capacity of the battery at a cycle prior to the first cycle, and to predict an RUL of the battery based on the calculated capacity fade.

7. The apparatus of claim 5, further comprising a controller comprising sensors configured to determine the degradation parameters.

8. The apparatus of claim 5, wherein the predictor is further configured to control a display of the predicted RUL to indicate a time remaining until the battery reaches an end-of-life (EOL) state.

9. A non-transitory computer readable storage medium comprising a computer executable program code to cause a computer program to perform:
   measuring an operating current during a charging cycle and a discharging cycle of a battery;
   calculating a capacity fade at a first cycle of the battery based on the measured operating currents, a state of charge (SOC) limit, a minimum SOC, a maximum SOC, and a capacity of the battery at a cycle prior to the first cycle; and
   predicting a remaining useful life (RUL) of the battery based on the calculated capacity fade.

10. The method of claim 1, wherein the capacity fade at the current cycle is calculated based on $$(C_{rel}^n)^{0.5} - (C_{rel}^{n-1})^{0.5} = -B(T)\int_0^{\tau_{cyl}^{n-1}} \exp\left[A\left(SOC_{pos}^{lim} - SOC_{pos}^{min} - \frac{SOC_{pos}^{max} - SOC_{pos}^{min}}{C_c^{n-1}}\int_0^t Idt\right)\right]dt,$$

and
   wherein A and B(T) are battery parameters, $SOC_{pos}^{lim}$ is a material property of the battery, $SOC_{pos}^{max}$ and $SOC_{pos}^{min}$ are constants based on a design of the battery, $C_c^{n-1}$ is a capacity corresponding to an $(n-1)^{th}$ cycle of the plurality of cycles.

* * * * *